(12) United States Patent
Udayakumar et al.

(10) Patent No.: US 9,548,377 B2
(45) Date of Patent: Jan. 17, 2017

(54) THERMAL TREATMENT FOR REDUCING TRANSISTOR PERFORMANCE VARIATION IN FERROELECTRIC MEMORIES

(71) Applicant: Texas Instruments Incorporated, Dallas, TX (US)

(72) Inventors: Kezhakkedath R. Udayakumar, Dallas, TX (US); Kemal Tamer San, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/273,704

(22) Filed: May 9, 2014

(65) Prior Publication Data

US 2015/0079698 A1 Mar. 19, 2015

Related U.S. Application Data

(60) Provisional application No. 61/878,117, filed on Sep. 16, 2013.

(51) Int. Cl.

| H01L 29/66 | (2006.01) |
|---|---|
| H01L 21/324 | (2006.01) |
| H01L 27/115 | (2006.01) |
| H01L 49/02 | (2006.01) |

(52) U.S. Cl.
CPC ....... *H01L 29/66477* (2013.01); *H01L 21/324* (2013.01); *H01L 27/11507* (2013.01); *H01L 28/57* (2013.01); *H01L 29/66659* (2013.01)

(58) Field of Classification Search
CPC .................... H01L 27/11507; H01L 21/02225; H01L 28/57; H01L 28/55; H01L 21/324; H01L 29/66477; H01L 29/66659

USPC ................................ 257/295, 532, E21.008, E29.342,257/E27.016; 438/3
See application file for complete search history.

(56) References Cited

U.S. PATENT DOCUMENTS

| 4,151,007 | A | | 4/1979 | Levinstein et al. |
|---|---|---|---|---|
| 6,104,049 | A | * | 8/2000 | Solayappan ...... H01L 27/11502 257/15 |
| 6,348,416 | B1 | * | 2/2002 | Toya ................... H01L 21/4832 257/E23.124 |
| 6,656,748 | B2 | | 12/2003 | Hall et al. |
| 6,730,354 | B2 | | 5/2004 | Gilbert et al. |
| 7,304,339 | B2 | * | 12/2007 | Chen ............................ 257/295 |
| 8,134,204 | B2 | | 3/2012 | Benaissa et al. |
| 2002/0011616 | A1 | * | 1/2002 | Inoue ................ H01L 21/76802 257/295 |
| 2002/0048867 | A1 | * | 4/2002 | Peng et al. .................... 438/158 |
| 2002/0055233 | A1 | * | 5/2002 | Mitros .............. H01L 29/66659 438/299 |

(Continued)

*Primary Examiner* — John P Dulka
*Assistant Examiner* — Christina Sylvia
(74) *Attorney, Agent, or Firm* — Rose Alyssa Keagy; Charles A. Brill; Frank D. Cimino

(57) ABSTRACT

Thermal treatment of a semiconductor wafer in the fabrication of integrated circuits including MOS transistors and ferroelectric capacitors, including those using lead-zirconium-titanate (PZT) ferroelectric material, to reduce variation in the electrical characteristics of the transistors. Thermal treatment of the wafer in a nitrogen-bearing atmosphere in which hydrogen is essentially absent is performed after formation of the transistors and capacitor. An optional thermal treatment of the wafer in a hydrogen-bearing atmosphere prior to deposition of the ferroelectric treatment may be performed.

18 Claims, 5 Drawing Sheets

(56) References Cited

U.S. PATENT DOCUMENTS

| | | | |
|---|---|---|---|
| 2002/0058410 A1* | 5/2002 | Sung | H01L 21/28061 438/649 |
| 2005/0110081 A1* | 5/2005 | Pendharkar | H01L 29/0615 257/336 |
| 2005/0253191 A1* | 11/2005 | Pendharkar et al. | 257/335 |
| 2007/0096300 A1* | 5/2007 | Wang | B81B 3/0072 257/709 |
| 2011/0079884 A1* | 4/2011 | Basim et al. | 257/632 |
| 2013/0056811 A1* | 3/2013 | Lin | H01L 27/11507 257/295 |
| 2015/0079698 A1* | 3/2015 | Udayakumar | H01L 21/324 438/3 |
| 2016/0086960 A1* | 3/2016 | Wen | H01L 27/11507 257/295 |

\* cited by examiner

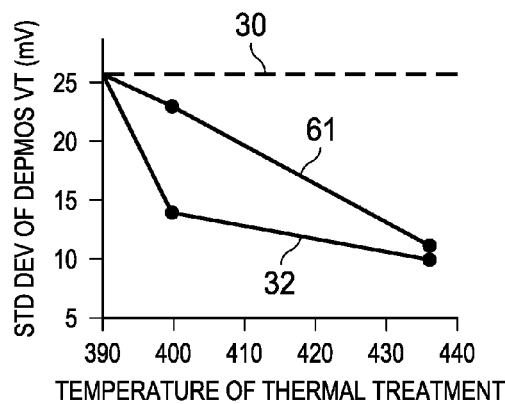 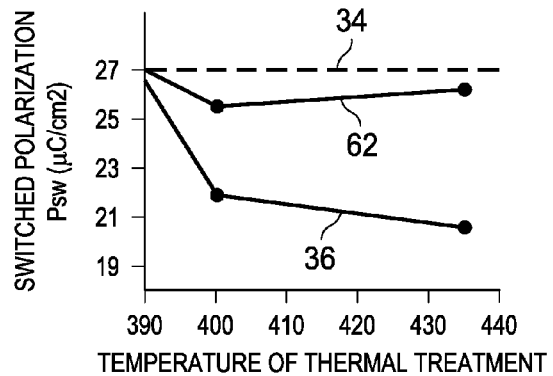
FIG. 5a  FIG. 5b
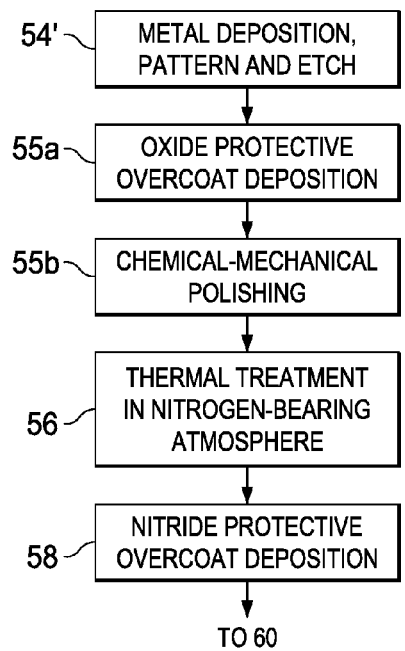
FIG. 6

THERMAL TREATMENT FOR REDUCING TRANSISTOR PERFORMANCE VARIATION IN FERROELECTRIC MEMORIES

CROSS-REFERENCE TO RELATED APPLICATIONS

This application claims priority, under 35 U.S.C. §119(e), of Provisional Application No. 61/878,117, filed Sep. 16, 2013, incorporated herein by this reference.

STATEMENT REGARDING FEDERALLY SPONSORED RESEARCH OR DEVELOPMENT

Not applicable.

BACKGROUND OF THE INVENTION

This invention is in the field of integrated circuit manufacture. Embodiments of this invention are more specifically directed to the formation of capacitors in memory devices such as ferroelectric memories.

Conventional metal-oxide-semiconductor (MOS) and complementary MOS (CMOS) logic and memory devices are prevalent in modern electronic devices and systems, as they provide an excellent combination of fast switching times and low power dissipation, along with their high density and suitability for large-scale integration. As is fundamental in the art, however, those devices are essentially volatile, in that logic and memory circuits constructed according to these technologies do not retain their data states upon removal of bias power. Especially in mobile and miniature systems, the ability to store memory and logic states in a non-volatile fashion is very desirable. As a result, various technologies for constructing non-volatile devices have been developed in recent years.

A recently developed technology for realizing non-volatile solid-state memory devices involves the construction of capacitors in which the dielectric material is a polarizable ferroelectric material, such as lead-zirconium-titanate (PZT) or strontium-bismuth-tantalate (SBT), rather than silicon dioxide or silicon nitride as typically used in non-ferroelectric capacitors. Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits.

Non-volatile solid-state read/write random access memory (RAM) devices based on ferroelectric capacitors, such memory devices commonly referred to as "ferroelectric RAM", or "FeRAM", or "FRAM" devices, have been implemented in many electronic systems, particularly portable electronic devices and systems. FRAMs are especially attractive in implantable medical devices, such as pacemakers and defibrillators. Various memory cell architectures including ferroelectric capacitors are known in the art, including the well-known 2T2C (two transistor, two capacitor) cells, among others. Ferroelectric capacitors are also implemented in some integrated circuits as programmable analog capacitors.

FIG. 1a illustrates the construction of an example of a portion of an integrated circuit including a portion of a ferroelectric random access memory (FRAM). In this example, ferroelectric capacitor 15 and metal-oxide-semiconductor (MOS) transistor 17 are disposed at or near a semiconducting surface of a semiconductor substrate, although capacitor 15 and transistor 17 may instead be formed at the surface of a semiconductor layer that overlies an insulator layer, such as according to a silicon-on-insulator (SOI) technology as known in the art. In the example of FIG. 1a, isolation dielectric structures 11, gate electrode 16, and n-type source/drain regions 14 are disposed at or near the surface of substrate 10, in the conventional manner for MOS integrated circuits. N-channel MOS transistor 17 in the example of FIG. 1a includes n-type source/drain regions 14 at the surface of p-type substrate 10 (or of a p-type "well" formed into substrate 10, as the case may be), with gate electrode 16 overlying a channel region between source/drain regions 14, and separated from the channel region by a gate dielectric, as conventional. Interlevel dielectric 12 is disposed over transistor 17, with conductive plug 13 disposed in a contact opening through interlevel dielectric 12 to provide a conductive connection between one of source/drain regions 14 of transistor 17 and lower plate 20a of ferroelectric capacitor 15.

In the example of FIG. 1a, ferroelectric capacitor 15 is formed of a ferroelectric "sandwich" stack of conductive plates 20a, 20b, between which ferroelectric material 22 is disposed. Lower plate 20a is formed at a location overlying conductive plug 13, as shown in FIG. 1a, so as to be in electrical contact with the underlying source/drain region 14 by way of conductive plug 13. Lower conductive plate 20a and upper plate 20b are formed from one or more layers of conductive metals, metal oxides, and the like. A typical construction of lower conductive plate 20a is a stack of a diffusion barrier layer in contact with conductive plug 13 and a layer of a noble metal (e.g., Ru, Pt, Ir, Rh, Pt, Pd, Au) or metal oxide (e.g., RuOx, IrOx, PdOx, $SrRuO_3$) overlying the barrier layer and in contact with the ferroelectric material 22. Conductive plates 20a, 20b are typically formed of the same conductive material or materials as one another, for purposes of symmetry, simplicity of the manufacturing flow, and improved ferroelectric polarization performance.

As mentioned above, ferroelectric material 22 in this conventional transistor 15 is typically lead-zirconium-titanate (PZT) or strontium-bismuth-tantalate (SBT), deposited by way of metalorganic chemical vapor deposition. Ferroelectric material 22 in capacitor 15 is desirably as thin as practicable, for purposes of electrical performance (e.g., polarization), and for consistency with the deep sub-micron features used to realize modern integrated circuits.

By way of background, conventional manufacturing process flows for the fabrication of CMOS integrated circuits include a thermal treatment process, following the formation of transistors 17, that has the effect of stabilizing the electrical characteristics of transistors 17. This thermal treatment (also commonly referred to as an "anneal" or "sinter") is typically performed by heating the wafer to an elevated temperature in a hydrogen-bearing atmosphere for a selected duration of time. An example of such a thermal treatment is the heating of the wafer to about 435° C. for about ten minutes in a flow of "forming gas" (i.e., a mixture of hydrogen and nitrogen), followed by twenty minutes at about 435° C. in a flow of pure hydrogen. For CMOS integrated circuits, this thermal treatment has been observed to substantially reduce the variation in transistor electrical characteristics (e.g., threshold voltage) from die-to-die on the same wafer, and from wafer-to-wafer within a manufacturing lot. In conventional CMOS manufacturing flows, this thermal treatment is typically performed at a later stage in the process, for example after formation of metal conductors and prior to the deposition of a protective overcoat layer. It is believed that this thermal treatment causes hydrogen ions to passivate charge trapping sites in the gate regions of the MOS transistors, which reduces transistor threshold voltage variation caused by intra-wafer and inter-wafer defect density variations.

However, it has been observed that this thermal treatment in a hydrogen-bearing atmosphere degrades the polarization characteristics of ferroelectric material 22, particularly for the case of PZT. This deleterious effect necessitates omitting the hydrogen anneal thermal treatment from the conventional process flow in the manufacture of CMOS integrated circuits containing ferroelectric capacitors, such as FRAM integrated circuits. The resulting variation in transistor electrical characteristics among a population of these devices as manufactured may require some yield loss to be tolerated, or may necessitate relaxation of design specifications (circuit performance, device sizes, etc.) from what may otherwise be attainable for the technology node.

One conventional approach toward addressing this threshold voltage variation is the use of a targeted threshold adjust ion implantation to shift the threshold voltage distribution so as to better tolerate the variation if the thermal treatment is not performed. However, as known in the art, this technique is not available for integrated circuits that include MOS transistors of the "drain-extended" type (i.e., "DEMOS" transistors), as are common in modern integrated circuits intended for high voltage applications.

FIG. 1b illustrates, in cross-section, an example of an integrated circuit including such a DEMOS transistor 17'. DEMOS transistor 17' is constructed similarly to transistor 17 of FIG. 1a, but in this example is not connected directly to an instance of ferroelectric capacitor 15, as is typical for integrated circuits including both DEMOS transistors and embedded FRAM arrays (the FRAM cells typically do not involve the high voltages for which DEMOS transistors are needed, especially considering the additional chip area required for the DEMOS transistors). In this instance of n-channel DEMOS transistor 17', source/drain regions 14, 14' are heavily-doped n-type, as in transistor 17 of FIG. 1a. However, drain region 14' is not disposed adjacent to the channel region of transistor 17'. Rather, n-type drain drift region 19 is disposed at the surface of substrate 10, between the more heavily doped n-type drain region 14 and the channel region underlying gate electrode 16. N-type drain drift region 19 is lightly-doped relative to the heavily-doped n+ drain regions 14, 14', as known in the art. The presence of drain drift region 19 reduces the vulnerability of transistor 17' to hot carrier degradation, particularly in high voltage applications. As such, DEMOS transistors are attractive in higher-voltage applications, considering that modern submicron non-DEMOS transistors are restricted to relatively low voltages (e.g., on the order of one volt).

However, conventional manufacturing methods do not provide independent control of the threshold voltage of DEMOS transistors. As such, the targeted threshold adjust implant cannot address threshold voltage variation among DEMOS transistors if the use of a hydrogen anneal to reduce the variance in transistor characteristics is precluded by the ferroelectric devices, as discussed above. Accordingly, integrated circuits having both DEMOS transistors and ferroelectric capacitors must be designed with sufficient design margin so as to tolerate a relatively wide variation in transistor characteristics. This re-specification of the design necessarily results in less-than-optimal circuit performance or larger chip area requirements.

BRIEF SUMMARY OF THE INVENTION

Disclosed embodiments provide a method of manufacturing an integrated circuit including metal-oxide-semiconductor (MOS) transistors and ferroelectric capacitors in which the electrical characteristics of MOS transistors can be tightly controlled.

Disclosed embodiments provide such a method that is compatible with, and does not unduly degrade, polarization characteristics of the ferroelectric material.

Disclosed embodiments provide such a method that is compatible with modern manufacturing process flows including those implementing high-performance ferroelectric films suitable for use in modern deep submicron integrated circuits.

Other objects and advantages of the disclosed embodiments will be apparent to those of ordinary skill in the art having reference to the following specification together with its drawings.

Some of the disclosed embodiments are implemented in a method of fabricating integrated circuits including metal-oxide semiconductor (MOS) transistors and ferroelectric capacitors, for example capacitors including a ferroelectric material of lead-zirconium-titanate (PZT). Thermal treatment of the wafer on which the integrated circuits are formed is performed in a nitrogen atmosphere, in the absence of a significant concentration of hydrogen, and after formation of the transistors and capacitor.

BRIEF DESCRIPTION OF THE SEVERAL VIEWS OF THE DRAWING

FIGS. 5a and 5b are plots of measured threshold voltage variation, and switching polarization, respectively, versus thermal treatment temperature according to an embodiment, as compared with the plots of FIGS. 3a and 3b.

FIG. 6 is a flow diagram illustrating, in more detail, a portion of the process of FIG. 4 according to an embodiment.

DETAILED DESCRIPTION OF THE INVENTION

The one or more embodiments disclosed in this specification are described as implemented into the manufacture of semiconductor integrated circuits that include ferroelectric films, because it is contemplated that such implementation is particularly advantageous in that context. However, it is also contemplated that those skilled in the art having reference to this specification will recognize that concepts of this invention may be beneficially applied to other applications. Accordingly, it is to be understood that the following description is provided by way of example only, and is not intended to limit the true scope of this invention as claimed.

This description will refer to thermal treatment of semiconductor devices and wafers. Various terms in the art are commonly used to refer to such thermal treatment processes, including the terms "anneal" and "sinter". For purposes of this description, we will use the term "thermal treatment" to refer to the treating of a semiconductor wafer or devices at an elevated temperature, for a certain duration in a selected gaseous atmosphere. As such, it is intended that the term "thermal treatment" corresponds to such processes that are referred to in the art as "anneal", "sinter", and the like.

As fundamental in the art, integrated circuits provide the benefit of close matching among active devices in the same circuit instance, because all of the transistors in the circuit are fabricated simultaneously under the same conditions. This device matching allows for optimized circuit design by minimizing the design margin necessary to allow for variations in transistor characteristics. Close matching among active device characteristics is especially important in many analog circuits that rely on device matching. However, some modern integrated circuits with device feature sizes in the deep sub-micron regime are vulnerable to certain mechanisms that cause undesirable variation in transistor characteristics. One such mechanism is the presence of charge trapping sites at the interface between silicon and silicon dioxide, at the gate and channel region of the MOS transistor; charge that becomes trapped at those sites, for example as a result of later high-temperature processes in the manufacturing flow, will change the threshold voltage of the transistor. The density of these charge trapping sites can vary over the surface of a wafer, and from wafer to wafer. Accordingly, this mechanism can increase the variance in threshold voltage from die to die within a wafer, and from wafer to wafer. MOS transistors in modern high-performance integrated circuits are especially vulnerable to this effect, as the characteristics of these extremely small devices are affected by even small amounts of trapped charge.

Figure 2:
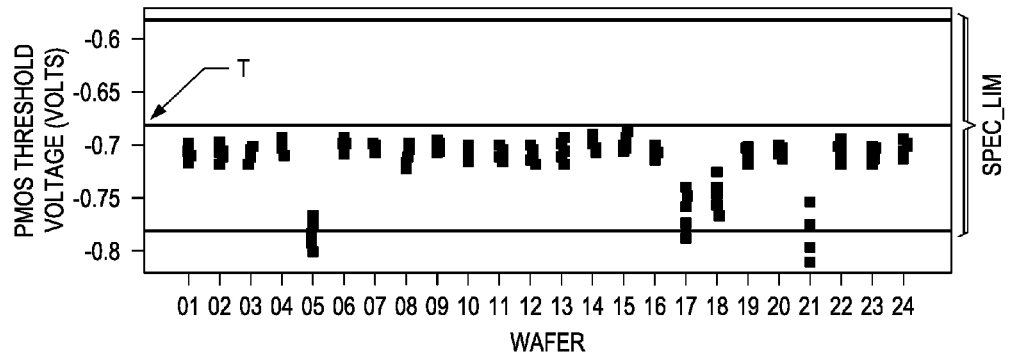
FIG. 2 is a plot of transistor threshold voltage measurements by wafer for integrated circuits constructed according to conventional processes.

FIG. 2 illustrates an example of this variation over a lot of twenty-four wafers. In this example, p-channel MOS transistor threshold voltages are measured at a number of locations on each wafer; target threshold voltage T is about −0.675 volts, and specification limits SPEC_LIM range from about −0.575 to about −0.775 volts. As evident from FIG. 2, certain wafers (wafers 5, 17, 19, and 21) exhibit threshold voltages that vary significantly from the threshold voltages measured on the other wafers, with some threshold voltages on those wafers falling below the lower specification limit. In addition to this large interwafer variance, these same wafers 5, 17, 19, and 21 each exhibit a wider intra-wafer threshold voltage variance than do the other wafers in the lot. This non-uniformity in transistor threshold voltage will typically be reflected in test yield loss, or may require loosening of functional specifications and performance requirements to avoid that yield loss.

As discussed above in the Background of the Invention, this intra-wafer and inter-wafer non-uniformity in transistor characteristics has been addressed, in conventional process flows, by incorporating a high temperature thermal treatment in a hydrogen-bearing atmosphere such as a flow of forming gas (i.e., a mixture of hydrogen and nitrogen). This conventional hydrogen thermal treatment has been performed near the end of the process flow, after other high-temperature processes that have been performed since transistor formation.

Figure 3A:
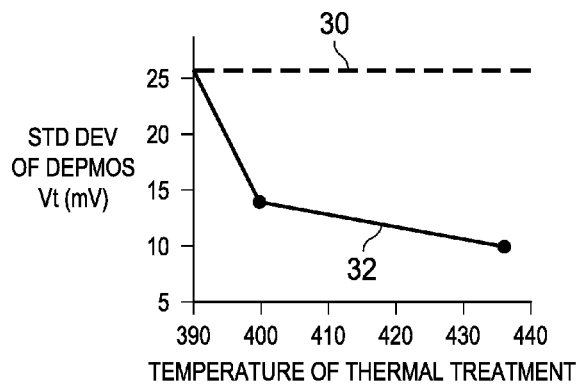
FIGS. 3a and 3b are plots of measured threshold voltage variation, and switching polarization, respectively, versus conventional thermal treatment temperature for integrated circuits including ferroelectric capacitors.

FIG. 3a illustrates the effect of conventional thermal treatment on a population of p-channel DEMOS transistors, by way of the standard deviation of measured threshold voltage data over this population for a control group receiving no thermal treatment (plot 30), and groups from that population receiving thermal treatment at certain anneal temperatures (plot 32). In this example, the thermal treatment for which the measurements of plot 32 was performed by heating wafers on which the transistors were formed in a furnace to the specified temperature for ten minutes in an atmosphere of forming gas (mixture of $H_2$ and $N_2$) followed by twenty minutes at that same temperature in an atmosphere of pure hydrogen, at a point near the end of the overall manufacturing flow (i.e., immediately prior to deposition of a nitride protective overcoat layer). As shown by plot 30 in this FIG. 3a, p-channel DEMOS transistors in the control group of this population that did not receive a thermal treatment had a standard deviation in threshold voltage of about 26.6 mV. As shown by plot 32, thermal treatment of these devices in forming gas and hydrogen at a temperature of about 400° C. reduced the standard deviation of the measured threshold voltages to about 14 mV. The same thermal treatment at a temperature of about 435° C. reduced the threshold voltage standard deviation to about 10 mV. Accordingly, this conventional thermal treatment in a hydrogen-bearing atmosphere desirably reduces the variance of transistor threshold voltages, thus increasing the process capability $C_{pk}$ (i.e., specification window divided by some multiple of the standard deviation). Similar results have also been observed in connection with CMOS transistors (i.e., transistors without the drain drift region of DEMOS transistors).

Figure 1A:
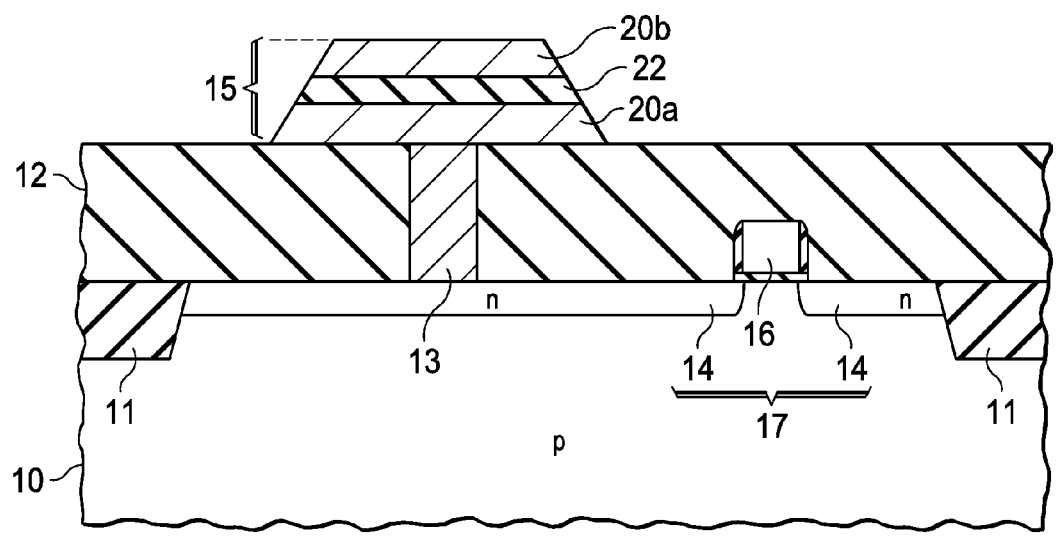
FIG. 1a is a cross-sectional view of a portion of a conventional integrated circuit including a ferroelectric capacitor at a selected stage of manufacture.
Figure 1B:
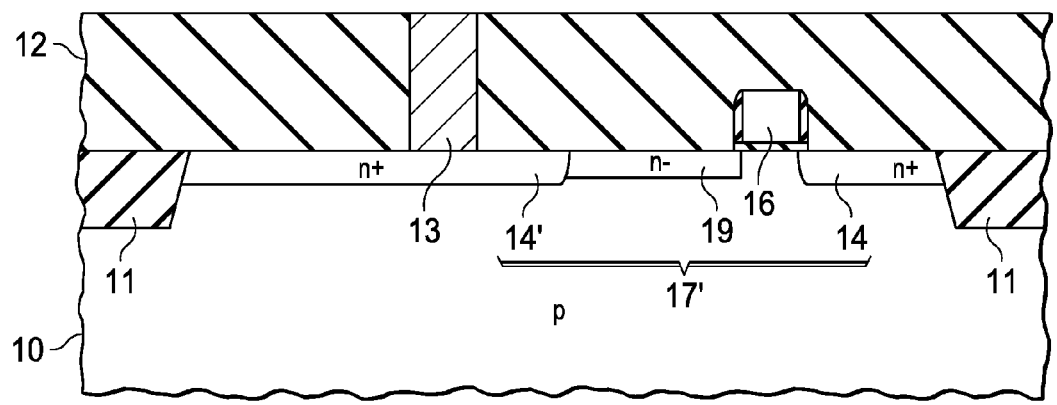
FIG. 1b is a cross-sectional view of a portion of a conventional integrated circuit including a drain-extended metal-oxide-semiconductor (DEMOS) transistor.
Figure 3B:
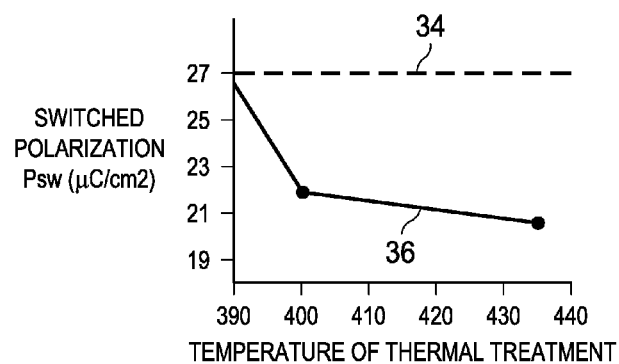

However, it has been observed that this thermal treatment has a deleterious effect on PZT ferroelectric material, such as that used in ferroelectric capacitors as discussed above relative to FIG. 1a. FIG. 3b illustrates this degradation with reference to the parameter of switched polarization (Psw) for PZT ferroelectric capacitors in the same devices for which the p-channel DEMOS threshold voltages were measured in FIG. 3a. Plot 34 illustrates that the measured switched polarization for the control group of PZT ferroelectric capacitors, i.e. that did not receive thermal treatment in a hydrogen-bearing atmosphere, was about 27 $\mu C/cm^2$. Plot 36 illustrates the effect of the thermal treatments on these ferroelectric capacitors. Those receiving the 400° C. thermal treatment (10 mins. in forming gas followed by 20 mins. in $H_2$) exhibited a degradation in switched polarization down to about 22 $\mu C/cm^2$, and those receiving the 435° C. thermal treatment exhibited a degradation in switched polarization down to about 21 $\mu C/cm^2$.

Accordingly, in order to attain the reduced variance in transistor threshold voltage provided by the conventional thermal treatment in a hydrogen-bearing atmosphere, a significant degradation in switching polarization of the ferroelectric capacitors must be tolerated; conversely, simply eliminating the hydrogen-bearing thermal treatment will maintain good switched polarization for the ferroelectric capacitors, but at a cost of increased variance in transistor characteristics and the resulting yield loss or loss in device performance.

According to the embodiments disclosed in this specification, a thermal treatment is provided that reduces the variance in transistor characteristics but does not significantly degrade the polarization of ferroelectric capacitors in the same integrated circuit. A process of fabricating integrated circuits including MOS transistors and ferroelectric capacitors according to disclosed embodiments will now be described with reference to FIG. 4.

Figure 1C:
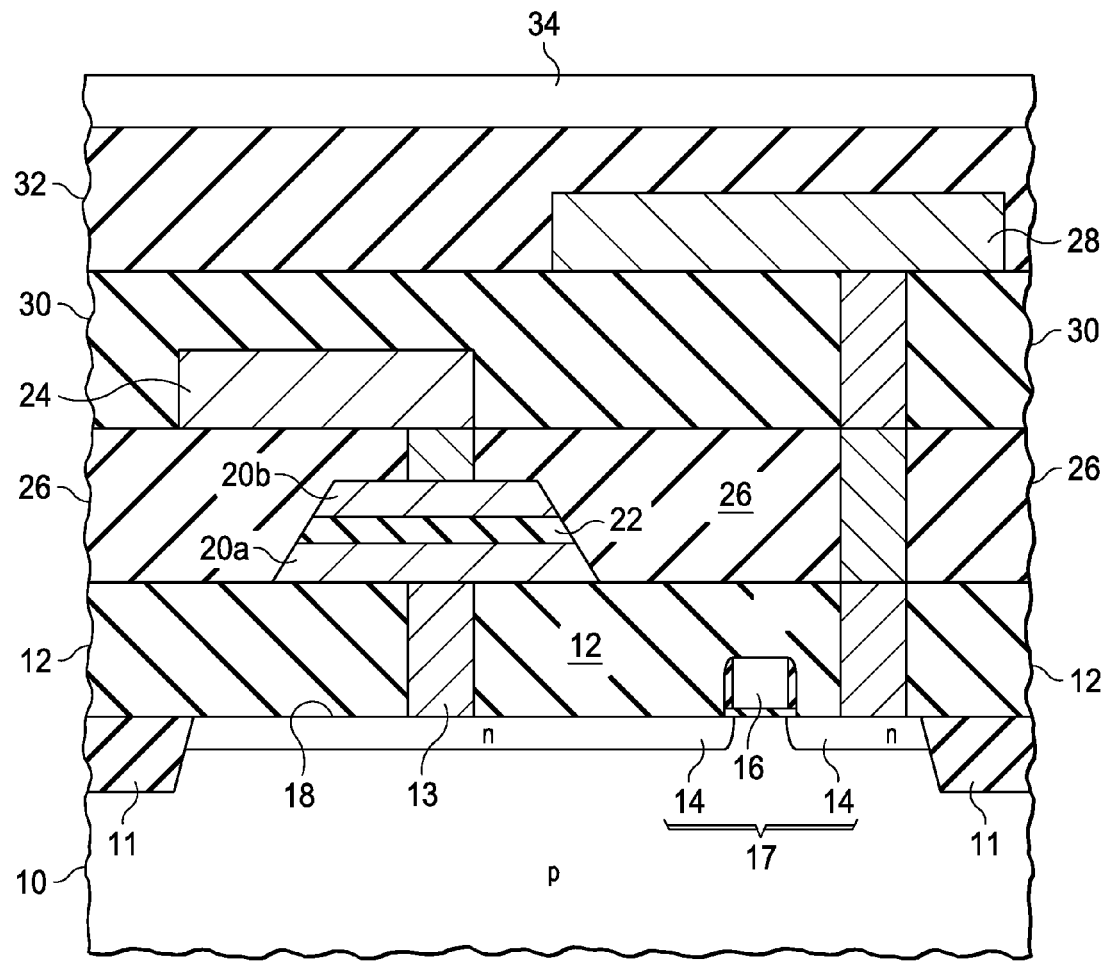
FIG. 1c is a cross-sectional view of the integrated circuit of FIG. 1a at a later stage of manufacture.
Figure 4:
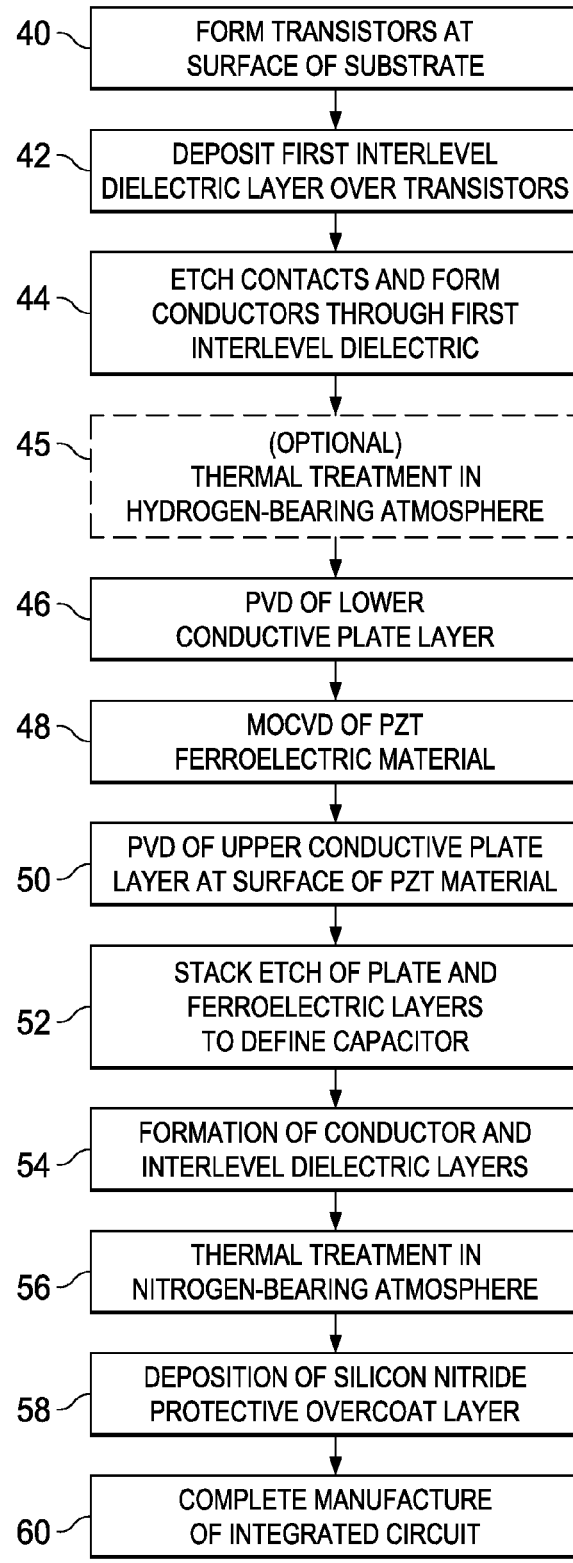
FIG. 4 is a flow diagram illustrating a process of fabricating an integrated circuit according to the disclosed embodiments.

In process 40 of FIG. 4, transistors such as transistor 17 and DEMOS transistor 17' are formed in the conventional manner at or near the semiconducting surface (element 18 of FIG. 1c) of substrate 10 or other support body. As part of this process 40, isolation dielectric structures 11, the appropriate doped wells (not shown), a gate dielectric layer, gate electrodes 16, and source/drain regions 14, among other structures, are formed at or near the surface of substrate 10 according to conventional MOS processes. For example, MOS transistor 17 of Figure 1a may be formed in the conventional manner by deposition and photolithographic patterning and etch of polysilicon material to define gate electrode 16 overlying a gate dielectric, with n-type source/drain regions 14 formed on either side of gate electrode 16 by ion implantation and subsequent activation anneal, in the well-known self-aligned manner. If DEMOS transistors 17' are to be formed, process 40 includes the appropriate conventional processes for also forming drain drift regions 19 between the drain regions 14 and the channel regions underlying gate electrodes 16 of those DEMOS transistors 17'; drain drift regions 19 will be relatively lightly-doped relative to their corresponding drain regions 14, as known in the art for DEMOS transistors. If a CMOS integrated circuit is being fabricated, process 40 will form both p-channel and n-channel transistors 17, 17', as well known in the art.

In process 42, first interlevel dielectric 12 is then deposited over the transistors formed in process 40, for example by way of chemical vapor deposition, followed by planarization if desired. In process 44, contact openings (i.e., vias) are etched through first interlevel dielectric 12 at selected locations, and conductive plugs 13 are formed into those openings in the conventional manner to provide electrical contacts at the desired locations. For FRAM memory cell structures such as that shown in FIG. 1a, some of these conductive plugs 13 formed in process 44 will connect source/drain regions 14 of MOS transistors 17 with lower plates 20a of eventual ferroelectric capacitors 15. Conductive plug 13 may be formed of a metal such as tungsten, titanium, and the like, or an alloy thereof.

Following the formation of first interlevel dielectric layer 12 in process 42, and the contact etch and conductor formation in process 44 (and, perhaps, optional process 45, which will be described in further detail below), ferroelectric capacitors 15 are then formed, beginning with process 46. In a general sense, process 46 forms one or more conductive layers over first interlevel dielectric layer 12 and conductive plugs 13, to serve as the lower conductive plate layer for capacitor 15. Typically, process 46 will be performed by the physical vapor deposition (PVD) of one or more layers of conductive material in succession, for example by way of sputter deposition or another suitable PVD technique. One or more oxidation or diffusion barrier layers may also be deposited in process 46, as known in the art. Also in process 46, one or more layers of conductive metal, for example iridium, are then sputter deposited to form the lower conductive plate layer 20a.

Following lower conductive plate layer deposition process 46, ferroelectric material 22 is then deposited overall in process 48, according to this embodiment. In one example of this embodiment, process 48 is performed by conventional metalorganic chemical vapor deposition (MOCVD) of lead-zirconium-titanate (PZT). An example of PZT deposition process 48 suitable for use in connection with this embodiment is described in commonly assigned U.S. Pat. No. 6,730,354, incorporated herein by reference.

Upon completion of PZT deposition process 48, upper conductive plate layer 20b is then deposited over PZT ferroelectric material 22 in process 50. It is contemplated that the composition of upper conductive plate layer 20b will typically be the same as that of lower conductive plate layer 20a, for symmetry and to allow the use of the same materials and processes for each. In embodiments in which lower and upper conductive plate layers 20a, 20b are each composed of a stack of multiple conductive materials, the order of those materials in layers 20a, 20b will typically be reversed. It is contemplated that deposition process 50 will typically be performed by sputter deposition, although other techniques for depositing conductive materials may alternatively be used.

In process 52, ferroelectric capacitor 15 is then completed by the deposition of a hard mask layer (e.g., a stack of TiAlON/TiAlN), and photolithographic patterning and etching of the hard mask layer using photoresist, to define the size and location of ferroelectric capacitor 15. Following the patterning and etch of the hard mask layer, a single masked stack etch of conductive plates 20a, 20b, and ferroelectric material 22 is performed, also in process 46. Commonly assigned U.S. Pat. No. 6,656,748, incorporated herein by reference, describes an example of ferroelectric stack formation and etch process suitable for use in connection with embodiments of this invention. Additional processing to complete ferroelectric capacitor 15, such as the formation of passivation films such as described in U.S. Patent Application Publication US 2013/0056811, commonly assigned herewith and incorporated herein by this reference, may also be performed. The formation of one or more conductor levels 24, 28 above ferroelectric capacitors 15, and the formation of interlevel dielectric layers 26, 30, 32 between those conductor levels, are then formed in process 54 by way of conventional deposition and etch techniques, as well known in the art.

Following this process 54, and therefore at a point near the end of the overall manufacturing process flow, thermal treatment process 56 is performed. According to these embodiments, thermal treatment process 56 is performed by heating one or more wafers on which the integrated circuits have been partially fabricated up to this point to a selected temperature, for a selected duration of time, in a process chamber containing a non-hydrogen-bearing atmosphere. The chamber in which process 56 is performed may be a conventional semiconductor processing furnace, as suitable for simultaneously thermally treating a batch including multiple wafers (e.g., a wafer lot). Alternatively, the chamber in which process 56 is performed may be a single wafer thermal processing apparatus. In either case, the selected temperature is measured and maintained in the conventional manner for thermal processing apparatuses of the batch or single wafer types.

The non-hydrogen-bearing atmosphere in which thermal treatment process 56 is performed refers to the exposure of the wafers to a gas flow, or to a non-flowing ambient atmosphere, as the case may be, in which the constituent gases introduced into or present within the process chamber do not include a significant concentration of hydrogen. In one example of this embodiment, thermal treatment process 56 is performed at a temperature of about 435° C. in a gas flow of essentially pure nitrogen at a flow rate from about 10,000 sccm to about 20,000 sccm, for example 15,000 sccm, for a duration of about 30 minutes. Alternatively, the gas flow or non-flowing ambient atmosphere may consist of a mixture of nitrogen and one or more inert gases, for example argon. In any case, it is believed that the nitrogen in the atmosphere will generally be non-reactive under the conditions of thermal treatment process 56. Further in the alternative, process 56 may be performed at other temperatures, in atmospheres of other non-hydrogen-bearing gases or mixtures and flow rates, and for different durations, in order to attain important the benefits described in this specification. However, it is contemplated that these benefits are somewhat sensitive to the temperature at which thermal treatment process 56 is performed in an essentially nitrogen atmosphere, as will now be discussed relative to FIGS. 5a and 5b.

FIGS. 5a and 5b include the plots discussed above relative to FIGS. 3a and 3b, respectively, but additionally include measurements observed for integrated circuits receiving thermal process 56 as described above. Referring first to FIG. 5a, which illustrates the measured standard deviation of a population of p-channel DEMOS transistors, plot 61 illustrates the measured threshold voltage standard deviation for transistors receiving thermal treatment process 56 according to embodiments disclosed in this specification. For the case in which thermal treatment process 56 was performed at a temperature of about 400° C. for 30 minutes in a gas flow of pure nitrogen, the measured threshold voltage standard deviation fell from about 26.6 mV for the population receiving no thermal treatment, to about 23 mV as shown by plot 61. Plot 61 further shows that the measured threshold voltage standard deviation for these transistors for the case in which thermal treatment process 56 was performed at a temperature of about 435° C., again for about 30 minutes in a gas flow of pure nitrogen, was reduced to slightly above 10 mV. As such, thermal treatment process 56 in a non-hydrogen-bearing atmosphere (e.g., pure nitrogen), at this temperature of 435° C., is able to attain the same improved and reduced variance in transistor characteristics as that attained by conventional hydrogen anneal processes (shown by plot 32 of FIG. 5a). This improvement has been observed for both p-channel and n-channel MOS and DEMOS transistors.

FIG. 5b illustrates that the benefit of this reduced variance is attained without significantly degrading PZT ferroelectric material 22, according to this embodiment. Plot 62 illustrates the measured switched polarization Psw values for ferroelectric capacitors 15 constructed on the same integrated circuits as the transistors measured by plot 60 of FIG. 5a. As evident from plot 62 in FIG. 5b, the instance of thermal treatment process 56 performed at a temperature of about 435° C. in pure nitrogen, which greatly reduced the variance in transistor characteristics shown by plot 60 of FIG. 5a, only minimally degraded the switched polarization Psw of ferroelectric capacitors 15 (to about 26 $\mu C/cm^2$ as compared with about 27 $\mu C/cm^2$ for those receiving no thermal treatment). While slightly lower switched polarization was measured for those devices receiving thermal treatment process 56 at 400° C. than at 435° C., it is contemplated that this difference is within the sampling error of the measurements.

Thermal treatment process 56 according to these embodiments is thus capable of providing the desirable reduction in the variance of transistor characteristics, both from die-to-die within a given wafer and from wafer-to-wafer, without significantly degrading the polarization performance of ferroelectric capacitors. As a result, these embodiments facilitate the manufacture of high performance MOS, CMOS, and DEMOS integrated circuits that include ferroelectric memory capability, by providing additional design and process margin to the circuits without degradation of the ferroelectric performance.

Referring back to FIGS. 1c and 4, following thermal treatment process 56, a protective overcoat layer 34 is then deposited in process 58. As known in the art, conventional processes for the chemical vapor deposition of silicon nitride, specifically silicon nitride of the desired stress characteristics (e.g., compressive), use hydrogen-bearing constituent gases, such as silane ($SiH_4$) and ammonia ($NH_3$). According to these disclosed embodiments, it is especially useful for thermal treatment process 56 to be performed prior to the deposition of such a silicon nitride protective overcoat layer in process 58, to avoid degradation of PZT ferroelectric material 22 by the hydrogen contained in the CVD gases for this silicon nitride deposition process. It has been observed, however, in connection with these embodiments, that protective overcoat deposition process 58 can be safely performed after thermal treatment process 56, as evident by the example of measurement data discussed above relative to FIGS. 5a and 5b. It is further contemplated that thermal treatment process 56 is optimally performed as late in the overall manufacturing process as possible, after other high-temperature processes in the process flow (e.g., PZT deposition process 48).

In some process flows, the protective overcoat may consist of multiple layers, including a deposited layer of silicon dioxide underlying a layer of silicon nitride. FIG. 6 illustrates a process flow for this situation, by way of additional detail for the "back-end" of the manufacturing process of FIG. 4. In this example, the deposition, pattern, and etch of the topmost metal conductor layer is performed in process 54'. Following completion of the formation of the top level metal conductors in the integrated circuit, a first protective overcoat layer of silicon dioxide is then deposited overall, in process 55a; this layer may be deposited in two or more process steps, as known in the art, to a thickness of on the order of 18 kÅ. Because conventional chemical vapor deposition of silicon dioxide does not require or release free hydrogen, oxide protective overcoat deposition process 64 does not significantly degrade ferroelectric material 22. The resulting silicon dioxide protective overcoat layer is then planarized as desired in chemical-mechanical polishing (CMP) process 55b.

Following the deposition and planarization of the silicon dioxide protective overcoat layer, thermal treatment process 56 is then performed as described above, for example by heating the wafers in a non-hydrogen-bearing atmosphere, for example at a temperature of about 435° C. in a gas flow of essentially pure nitrogen for a duration of about 30 minutes. Following thermal treatment process 56, a layer of silicon oxynitride (or of silicon nitride, or a stack of both) to serve as an upper protective overcoat layer is deposited in process 58, for example to a thickness of on the order of 8 kÅ. As known in the art and as described above, chemical vapor deposition of silicon nitride can release free hydrogen, which can diffuse into the ferroelectric capacitor stack and degrade ferroelectric material 22. According to the disclosed embodiments, it has been observed that the free hydrogen released in process 58 does not degrade the characteristics of ferroelectric material 22, due to thermal treatment 56 having been performed prior to oxynitride/nitride protective overcoat deposition process 58.

Conventional manufacturing process flows included a thermal treatment, for example a nitrogen anneal at a temperature such as 400° C., following the deposition of the nitride protective overcoat in process 58. According to this embodiment, however, that additional nitrogen anneal has been observed to be unnecessary. Rather, thermal treatment process 56 performed prior to oxynitride/nitride deposition process 58 has been observed to be sufficient to accomplish the effect of that post-overcoat nitrogen anneal. As such, this embodiment of the invention provides the additional benefit of reducing the number of thermal treatments at the "back-end" of the manufacturing process from two to one.

The manufacture of the integrated circuit is then completed in process 60 (FIG. 4), by conventional processes for patterning and etching openings through the protective overcoat, polishing of the backside of the wafer, electrical and other tests, etc., as known in the art.

It was previously understood that the conventional hydrogen anneal reduced the variance in transistor threshold voltage for MOS transistors because the hydrogen in the anneal gas has a passivating effect at the charge trapping sites in the gate and channel regions of the MOS transistors. The ability of the thermal treatment process in a non-hydrogen-bearing atmosphere according to these embodiments to accomplish the same result was therefore surprising. After having observed the results discussed above, it is now suspected, in connection with these embodiments, that residual hydrogen in the integrated circuit structure may be available to passivate the charge trapping sites in the MOS transistors, such that the nitrogen thermal treatment is sufficient to accomplish that same result. Considering this possible mechanism, it is believed that certain variations to the overall process flow may be able to assist the beneficial effect of the thermal treatment process in a non-hydrogen-bearing atmosphere, as will now be discussed, again with reference to FIG. 4.

The process flow of FIG. 4 in this alternative embodiment includes optional thermal treatment process 45 performed after the formation of transistors 17, 17' and prior to PZT deposition process 48. Specifically, it is contemplated that optional process 45 may be optimally performed prior to the deposition of lower conductive plate layer 20*a* in process 46. According to this alternative, thermal treatment process 45 is performed in a hydrogen-bearing atmosphere. In one example, thermal treatment process 45 is performed at 435° C. for ten minutes in an atmosphere of forming gas (e.g., a flow of $H_2$ at 4000 sccm and $N_2$ at 6000 sccm), followed by twenty minutes in an atmosphere of pure hydrogen (e.g., $H_2$ at 4000 sccm). It is contemplated that this thermal treatment process 45 can have the effect of inserting residual hydrogen into the transistor structure, that hydrogen being activated to passivate the charge trapping sites by subsequent thermal process 56 in a non-hydrogen-bearing atmosphere.

As discussed above, the disclosed embodiments can enable one or more advantages in the manufacture of integrated circuits including both MOS transistors and ferroelectric capacitors, as compared with conventional processes and technologies. In particular, the disclosed embodiments can result in MOS transistors with very tight distributions of electrical characteristics and thus excellent process capability $C_{pk}$, while not degrading the ferroelectric material in memory elements in the same integrated circuits. In addition, it is contemplated that these benefits can be attained with existing process equipment, and without increasing the complexity of the manufacturing process flow; indeed, it is contemplated that the manufacturing process may in some cases be simplified according to these embodiments.

While one or more embodiments have been described in this specification, it is contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an integrated circuit, comprising the steps of:
   forming at least one metal-oxide-semiconductor (MOS) transistor near a semiconducting surface of a body;
   then forming at least one ferroelectric capacitor near the surface of the body;
   forming an interlevel dielectric layer and a conductor level above the at least one ferroelectric capacitor;
   then thermally treating the body in a non-hydrogen-bearing atmosphere that includes a nitrogen-bearing gas; and
   then depositing a protective overcoat layer;
   wherein no thermal treatment is performed after the step of depositing the protective overcoat layer.

2. The method of claim 1, wherein the non-hydrogen-bearing atmosphere comprises nitrogen and at least one inert gas.

3. The method of claim 1, wherein the non-hydrogen-bearing atmosphere consists essentially of nitrogen.

4. The method of claim 3, wherein the thermally treating step comprises introducing, into a chamber containing the body, pure nitrogen gas to provide the non-hydrogen-bearing atmosphere.

5. The method of claim 3, wherein the thermally treating step is performed at a temperature at or above 400° C.

6. The method of claim 5, wherein the thermally treating step is performed at a temperature of about 435° C.

7. The method of claim 6, wherein the thermally treating step is performed for a duration of about 30 minutes.

8. The method of claim 1, wherein the thermally treating step is performed at a temperature at or above 400° C.

9. The method of claim 8, wherein the thermally treating step is performed at a temperature of about 435° C.

10. The method of claim 1, wherein the step of forming the at least one ferroelectric capacitor comprises:
    depositing a first conductive film over the MOS transistors;
    depositing ferroelectric material over the first conductive film:
    depositing a second conductive film overlying the ferroelectric material;
    removing portions of the first and second conductive films, and the ferroelectric material, at selected locations, to define a ferroelectric capacitor.

11. The method of claim 10, further comprising:
    prior to the step of depositing ferroelectric material, thermally treating the body in a hydrogen-bearing atmosphere.

12. The method of claim 11, wherein the hydrogen-bearing atmosphere comprises a mixture of hydrogen and nitrogen.

13. The method of claim 11, wherein the step of thermally treating the body in a hydrogen-bearing atmosphere comprises:
    introducing, into a chamber containing the body, a mixture of hydrogen and nitrogen for a first selected time duration;
    then introducing, into the chamber containing the body, a gas consisting essentially of hydrogen gas, for a second selected time duration.

14. The method of claim 1, wherein the step of forming at least one transistor comprises:
   forming a gate electrode overlying a gate dielectric layer at a selected location of the semiconducting surface of the body;
   doping selected locations of the semiconducting surface of the body to a first conductivity type to form source and drain regions;
   wherein the gate electrode and the source and drain regions are arranged so that at least a portion of the gate electrode overlies a channel region of the semiconducting surface of the body disposed between the source and drain regions, the channel region being of a second conductivity type.

15. The method of claim 14, wherein the step of forming at least one transistor further comprises:
   doping, to a first conductivity type, a selected location of the surface disposed between the drain region and the channel region to form a drain drift region, the drain drift region being more lightly doped than the drain region.

16. The method of claim 1, wherein the protective overcoat layer comprises silicon nitride, silicon oxynitride, or both.

17. The method of claim 16, further comprising:
   before the step of thermally treating the body, forming a lower protective overcoat layer comprising silicon dioxide.

18. The method of claim 17, further comprising:
   before the step of forming the lower protective overcoat layer, forming at least one level of metal conductors near the surface of the body.

\* \* \* \* \*